United States Patent

Shabde et al.

Patent Number: 6,147,507
Date of Patent: Nov. 14, 2000

[54] SYSTEM AND METHOD OF MAPPING LEAKAGE CURRENT AND A DEFECT PROFILE OF A SEMICONDUCTOR DIELECTRIC LAYER

[75] Inventors: Sunil N. Shabde, Cupertino; Yowjuang William Liu, San Jose; Ting Yiu Tsui, Palo Alto, all of Calif.

[73] Assignee: Advanced Micro Devices, Inc., Sunnyvale, Calif.

[21] Appl. No.: 09/131,305

[22] Filed: Aug. 10, 1998

[51] Int. Cl.[7] .................................................. G01R 31/26
[52] U.S. Cl. ........................... 324/766; 324/765; 324/452
[58] Field of Search ..................................... 324/766, 300, 324/316, 317, 318, 322, 72, 765, 767, 452; 365/120, 127, 151, 106, 107; 250/306, 307

[56] References Cited

U.S. PATENT DOCUMENTS

| | | |
|---|---|---|
| 4,706,015 | 11/1987 | Chen . |
| 4,803,435 | 2/1989 | Mills . |
| 4,816,755 | 3/1989 | Look et al. . |
| 5,418,363 | 5/1995 | Elings et al. ............................ 250/306 |
| 5,420,796 | 5/1995 | Weling et al. . |
| 5,426,302 | 6/1995 | Marchman et al. . |
| 5,436,448 | 7/1995 | Hosaka et al. ........................... 250/306 |
| 5,442,221 | 8/1995 | Mosser et al. . |
| 5,489,774 | 2/1996 | Akamine et al. . |
| 5,517,027 | 5/1996 | Nakagawa et al. . |
| 5,517,170 | 5/1996 | Peters et al. . |
| 5,520,769 | 5/1996 | Barrett et al. . |
| 5,528,067 | 6/1996 | Farb . |
| 5,543,988 | 8/1996 | Brady et al. . |
| 5,585,722 | 12/1996 | Hosoki et al. ........................... 324/318 |
| 5,619,139 | 4/1997 | Holczer et al. ........................... 324/318 |
| 5,652,151 | 7/1997 | Asada . |
| 5,668,395 | 9/1997 | Razeghi . |
| 5,675,532 | 10/1997 | Gemma et al. ........................... 365/151 |
| 5,710,052 | 1/1998 | Alvis et al. . |

*Primary Examiner*—Safet Metjahic
*Assistant Examiner*—Minh Tang
*Attorney, Agent, or Firm*—Amin, Eschweiler & Turocy, LLP

[57] ABSTRACT

A method (100) and a system (150) for detecting defects in a dielectric material (112) includes the steps of moving carriers (102) in the dielectric material (112), wherein the number of carriers is a function of whether defects exist in the dielectric material (112). The carriers are then deflected (130) toward a surface (116) of the dielectric material (112) using, for example, a magnetic field (132), and form an accumulated charge profile on the surface (116) of the dielectric material (112). The charge profile is then detected (140) and used to determine (180) the location of defects within the dielectric material (112).

21 Claims, 7 Drawing Sheets

SYSTEM AND METHOD OF MAPPING LEAKAGE CURRENT AND A DEFECT PROFILE OF A SEMICONDUCTOR DIELECTRIC LAYER

FIELD OF THE INVENTION

The present invention generally relates to a system and method for detecting defects in an interlayer dielectric of a semiconductor device and more particularly relates to detecting defects by enhancing carriers in the dielectric and deflecting them toward the dielectric surface using the Hall effect.

BACKGROUND OF THE INVENTION

There is an increasing demand for miniaturization in the integrated circuits industry. This demand has led to an ever constant reduction in separation between conductive lines (e.g., metal lines) in order to reduce integrated circuit size and/or increase density. The reduced spacing between the conductive lines has the undesirable effect of increasing the capacitance of whatever material lies between the conductive lines which may give rise to an undesirable phenomenon known as capacitive crosstalk.

In the past, overall integrated circuit (IC) performance depended primarily on device properties, however, this is no longer the case. Parasitic resistance, capacitance and inductance associated with interconnections and contacts of an IC are beginning to become increasingly significant factors in IC performance. In current IC technology, the speed limiting factor is no longer device delay, but the resistive-capacitive (RC) delays associated with the conductive interconnections of the IC (e.g., metal lines).

Conventional ICs typically employ an interconnect structure wherein a first conductive line is adjacent a second conductive line. If the crosstalk or capacitance between the first conductive line and the second conductive line is high, then the voltage on the first conductive line alters or affects the voltage on the second conductive line. This alteration in voltage may result in the IC being inoperable as a result of misinterpreting logic zeros, logic ones and voltage levels, and consequently incorrectly processing binary and/or analog information.

An exemplary semiconductor structure is illustrated in prior art FIG. 1. Prior art FIG. 1 illustrates a typical n-channel MOS transistor 10 between LOCOS-type isolation regions 12. The MOS transistor 10 includes source and drain regions 14 and 16 separated by a channel 18 in a substrate 20. A gate oxide 22 and a polysilicon gate 24 are formed on the substrate 20 over the channel 18. Conductive contacts 26a, 26b and 26c such as metal or a silicide are formed for the source 14, gate 24 and drain 16, respectively, and are isolated from one another with an insulating layer 28. The insulating layer 28 is often called an interlayer dielectric because with multi-layer metal semiconductor processes, the dielectric provides electrical insulation between the metal layers. A second level metal 30 is used to make selective contact down to one of the contacts 26b through the interlayer dielectric (ILD) 28.

Dielectric materials such as silicon dioxide are susceptible to ion contamination and moisture penetration. Furthermore, current deposition and polishing techniques have not reached a level where contamination of the ILD is eliminated. Additionally, voids within the ILD may result due to an imperfect fabrication process. Contaminants are undesirable in the ILD because the contaminants may degrade the performance of the ILD and facilitate unwanted capacitive crosstalk (e.g., leakage) between adjacent metal lines. Voids are not desired because the voids weaken the ILD and may lead to the formation of cracks within the ILD which may also give rise to leakage of current between adjacent metal lines.

Because defects in the interlayer dielectric may result in either parametric or functional device failures, it is desirable to test the interlayer dielectric to determine whether an undesirable number of such defects exist. One prior art method of testing an interlayer dielectric is illustrated in prior art FIG. 2, which illustrates two conductive lines 40 and 42 on a substrate 44 covered with an interlayer dielectric 46, wherein the conductive lines 40 and 42 are biased with a voltage source 48. A current meter 50 is placed in series with the voltage source 48 to measure the leakage current between the lines 40 and 42 flowing through the dielectric 46. Since leakage current is typically very small (e.g., in the order of picoamps), special current meters must be used to detect the leakage and thus are extremely expensive. In addition, such tests are difficult in isolating any detected leakage current from extraneous noise which may be detected.

One solution to the above problem of detecting low level leakage current is to substantially increase the voltage bias above the typical operating voltage in order to increase the leakage current to a more easily detectable level. Increasing the bias voltage in the above manner, however, stresses the dielectric 46 which may increase the leakage in the dielectric 46 and may even result in dielectric breakdown and thus a catastrophic device failure. Furthermore, in either prior art test scenario, a leakage current may be detected which indicates that one or more defects exist within the dielectric 46 and may even indicate an amount of such defects, thereby providing a pass/fail type performance indication. The prior art tests, however, provide no information regarding the location of the defects within the dielectric 46 that give rise to the leakage. Consequently, the test results do not provide defect location information and thus cannot be used significantly as a diagnostic tool in dielectric layer process development.

In addition to the above shortcomings in the prior art, detection of such defects (e.g., contaminants and voids) is typically performed at the end of the process line after the IC is substantially complete. However, the in-line fabrication of the IC represents up to 95% of the cost of the ultimate integrated circuit. Thus, it would be desirable to test the IC during fabrication in order to detect defects in the IC early on before additional monies are spent down the line for later fabrication steps.

In view of the above, it would be desirable to have a system and method for in-line detection of defects in the interlayer dielectric of an integrated circuit which provide not only an indication of whether one or more defects exist, but also indicate the location of the defects within the interlayer dielectric.

SUMMARY OF THE INVENTION

The present invention relates to a system and method for detecting defects in an interlayer dielectric material. Carriers corresponding to defects in the dielectric are moved and deflected toward a surface of the dielectric layer, thereby forming an accumulated charge profile on the surface. The accumulated charge profile is then detected and used to determine an amount and a location of defects in the dielectric material.

According to one aspect of the present invention, a voltage bias is applied to the interlayer dielectric using, for example, two conductive lines running through the dielectric material to induce a leakage current flow (moving the carriers in the material). The applied voltage is preferably applied at a level coincident with the operating voltage of the IC to avoid dielectric stress or breakdown. The carriers are then enhanced by exposing the dielectric material to light energy (e.g., a UV source). More particularly, by subjecting the dielectric to a light source with an energy level sufficient to inject carriers from the conductive lines, the amount of carriers within the dielectric increases. The carriers are moved via the light source by injecting electrons across the energy barrier between the conductive lines and the dielectric which results in the number of carriers being enhanced to a level suitable for measurement thereof.

The biased dielectric material is subjected to a magnetic field which is oriented in a direction perpendicular to the current path. The magnetic field deflects the carriers associated with both the defects and the light energy toward the surface of the dielectric material according to the Hall effect. The deflected carriers, after reaching the dielectric surface, then form an accumulated charge profile on the dielectric surface which is detected using a charge detector such as an atomic force microscope (AFM). The charge detector scans the dielectric surface with high spatial resolution and detects the accumulated charge across the dielectric surface to thereby provide a positional indication of the defects within the dielectric.

If ion contaminants are present within a portion of the dielectric material being tested, the amount of charge detected will be greater than if no such contaminants were present. The above phenomenon occurs because the ion contaminants provide trapping sites in the dielectric material which trap electrons. The trapped electrons, however, are trapped at an energy level greater than the electrons in the dielectric material and therefore require less energy than the dielectric material to be excited across the band-gap. The light energy is sufficient to excite the carriers across the band-gap of the ion contaminant. Accordingly, the presence of an ion contaminant will result in an increase in the amount of current (e.g., a greater number of carriers) at that point in the dielectric material compared to other regions in the dielectric having no such defects. Consequently, regions in the dielectric material having a defect will have a larger accumulated charge at the dielectric surface. Thus, by detecting the accumulated charge profile at the dielectric surface, the presence of ion contaminants within the dielectric material may be detected.

The present invention also detects the presence of voids in the dielectric material. With respect to voids, the amount of current flow (i.e., the number of carriers) in the dielectric material will be less than in regions where voids are not present. Consequently, the amount of charge which accumulates on the dielectric surface will be less than those regions having either no defects or ion contaminant type defects. Thus, detecting the accumulated charge profile on the dielectric surface may be used to determine an amount and a location of void type defects in the interlayer dielectric material.

According to another aspect of the present invention, a method of detecting a three-dimensional position of defects within an interlayer dielectric material is provided. According to one embodiment, a depth of the defect is ascertained by varying the wavelength to enhance carriers at varying depths and thus provide a plurality of accumulated charge profiles which may be used to determine the position of defects. A first light source wavelength is applied in which shallow carriers are moved and deflected toward the surface and detected while carriers at greater depths do not move and thus do not get deflected toward the surface. Subsequently, the light source wavelength is incrementally increased to move and deflect carriers from greater depths to the dielectric surface. At each incremental light source wavelength, the accumulated charge profile at the dielectric surface is detected and stored in a memory. The plurality of charge profiles reflecting varying wavelengths are then used to determined the two-dimensional location (X,Y) of the defects as well as their depth (Z) to thereby detect the three-dimensional position of the defects.

As demands for miniaturization increase, resulting in the need for moving conductive lines even closer together, the present invention may be employed to detect defects in an ILD of an integrated circuit early on and avoid performing continued fabrication steps on a defective IC. In addition, since the location of defects within the dielectric material may be determined, the present invention may be utilized as a diagnostic tool in interlayer dielectric process development.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
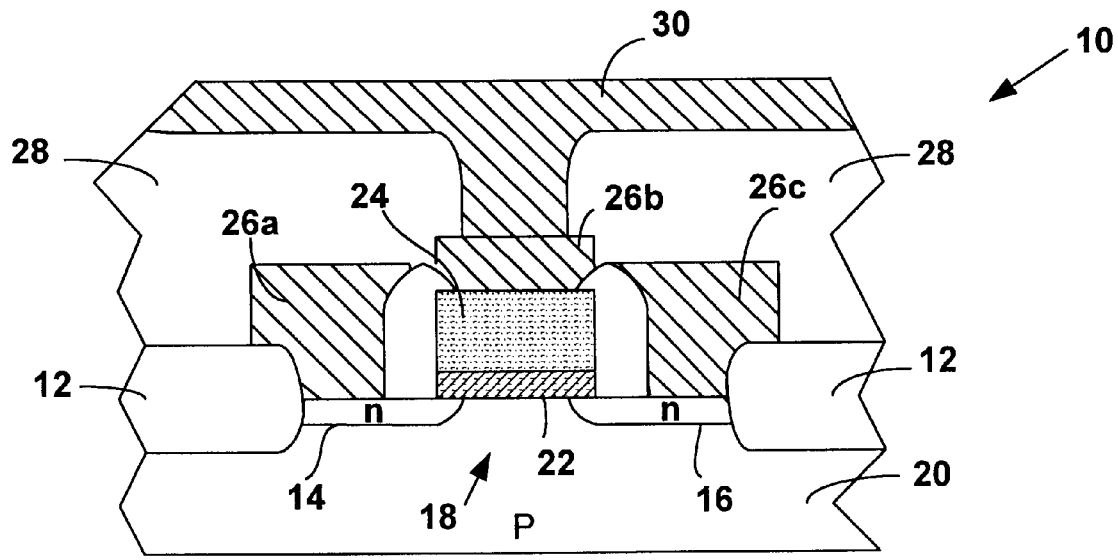
FIG. 1 is a fragmentary cross section diagram illustrating a prior art MOS transistor having multiple conductive layers separated by an interlayer dielectric.
Figure 2:
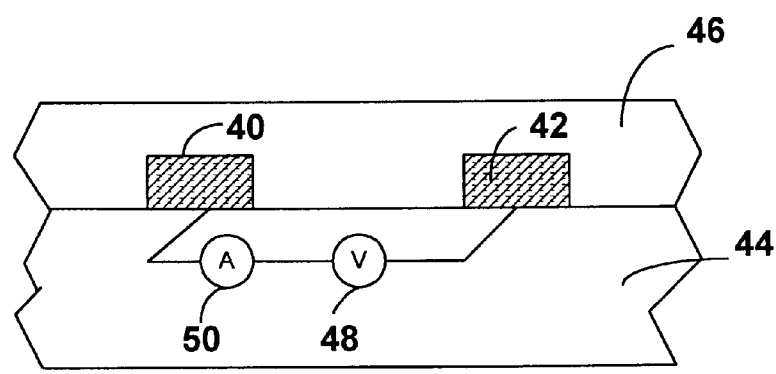
FIG. 2 is a fragmentary cross section diagram illustrating a prior art method of detecting defects in an interlayer dielectric by measuring a leakage current in the material.

The following is a detailed description of the present invention made in conjunction with the attached Figures, wherein like reference numerals will refer to like elements throughout. The present invention relates to a system and method of detecting defects in an interlayer dielectric (ILD) material. The invention includes moving an enhanced number of carriers in the ILD and deflecting the moved carriers to a surface of the ILD, thereby generating an accumulated charge profile on the ILD surface. The charge profile is then detected and used to identify the location of defects in the ILD. The charge profile provides positional location information of the defects because of trapping sites caused by contaminant ions in the ILD. Thus, when the carriers are moved, a greater number of carriers are present at or near the ion contaminant defects, which results in a charge accumulation at the surface at that location which is greater than other locations not containing defects. Similarly, void type defects provide fewer carriers at that location, thus voids will be reflected in a charge amount at that point which is less than other locations not containing defects. Consequently, the accumulated charge profile may be used to detect the defects in the ILD.

According to a preferred embodiment of the invention, the carriers are moved in the ILD by applying a voltage approximately equal to a typical operating voltage across two conductive lines being insulated by the ILD. The moved carriers thus represent carriers associated with the defects; the ILD leakage current. The ILD carriers are then enhanced by subjecting the ILD to light energy (hv), such as an ultraviolet light source, having an energy greater than an energy barrier between the conductive lines and the ILD, thus causing carrier injection from the conductive lines into the ILD. The carriers are deflected to a surface of the ILD according to the Hall effect by applying a magnetic field to the ILD which is oriented in a direction perpendicular to the carrier flow path. The deflected carriers reach and accumulate at the ILD surface, thus creating a charge profile (i.e., Hall voltage profile) which is then detected. Preferably, the charge profile is detected using an atomic force microscope (AFM) to thereby scan the ILD spatially with high precision and detect small changes in the surface charge.

According to another embodiment of the present invention, a three-dimensional ILD defect profile may be detected by moving carriers at different depths in the ILD and deflecting the moving carriers to the ILD surface for subsequent detection. For example, the wavelength of the light energy may be varied so that the light is absorbed at selected depths within the ILD and thus selectively controlling the depth at which enhanced carriers are moved. Alternatively, selected portions of the carriers in the ILD may be deflected by, for example, shielding portions of the ILD from the magnetic field. Consequently, the accumulated charge profiles corresponding to different ILD depths can be detected and analyzed to identify the three-dimensional position of the defects in the ILD.

Figure 3:
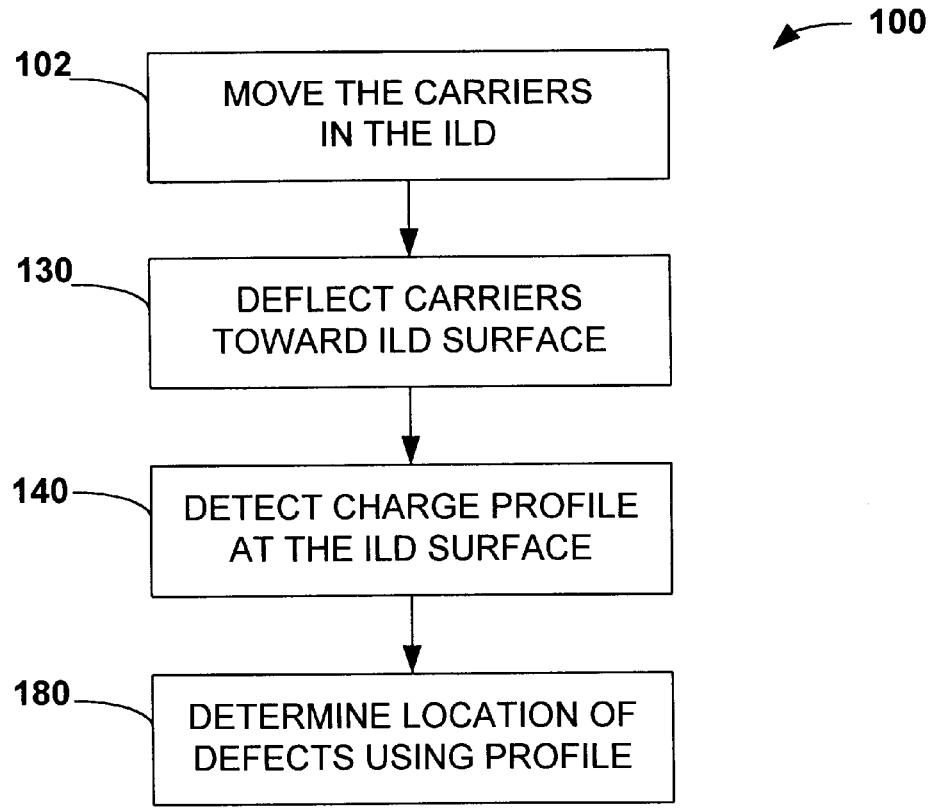
FIG. 3 is a flow chart diagram illustrating a method of detecting defects in an interlayer dielectric material according to the present invention.

Turning now to the Figures, FIG. 3 is a flow chart representing a method 100 for detecting the location of defects in an ILD material. According to a preferred embodiment of the present invention, the ILD material is a silicon dioxide ($SiO_2$); alternatively, however, the method of the present invention is also applicable to any type of ILD film or gate oxides, and each such film is contemplated as falling within the scope of the present invention.

At step 102 of the method 100, carriers are moved in the ILD material. The moving of carriers in the ILD may be accomplished through a variety of means, as is well known by those skilled in the art. Preferably, the carriers are moved in the ILD at step 102 by applying a bias voltage between conductive lines which are insulated from one another by the ILD, as illustrated in the flow chart of FIG. 4 at step 104. Applying a bias voltage includes applying a voltage source 106 to conductive lines 108 and 110 which are covered by the ILD 112, as illustrated in FIG. 5.

The moving of carriers relating to contaminant ions in insulative materials is well understood by those skilled in the art and gives rise to leakage current. Ion contaminants are defects in the ILD 112 which create trapping sites which trap carriers such as free electrons at energy levels which require less energy for the carriers to be excited across the band-gap (and thus into conduction). The number of carriers, however, due to the defects is small and therefore not easily detectable. Therefore the step of moving the carriers (step 102) also includes exposing the ILD 112 to light energy (hv), for example, ultraviolet light at step 114 of FIG. 4, thereby enhancing the number of carriers in the ILD 112. Alternatively, for example, E-beam technology may be used to enhance the number of carriers.

At step 114, the light source provides energy to carriers in the conductive lines 108 and 110, which heretofore did not have sufficient energies to overcome the metal/dielectric energy barrier of about 3.2 eV, which are injected into the ILD. Consequently, it is preferred that the energy of the light source be greater than the metal/oxide barrier height in order to ensure that a sufficient number of carriers are moved, thus enhancing the number of carriers in the ILD 112. In addition, since each material has an absorptive wavelength threshold, wherein wavelengths below the threshold are absorbed near the surface, it is preferred that the wavelength of the light be greater than the absorptive wavelength threshold of the ILD 112 (approximately 0.35 to 0.40 $\mu$m) so that the light is transmitted substantially through the ILD material 112. In addition, the wavelength and intensity of the light source may be varied to enhance the difference in carriers between a defect site and a non-defective site.

Figure 5:
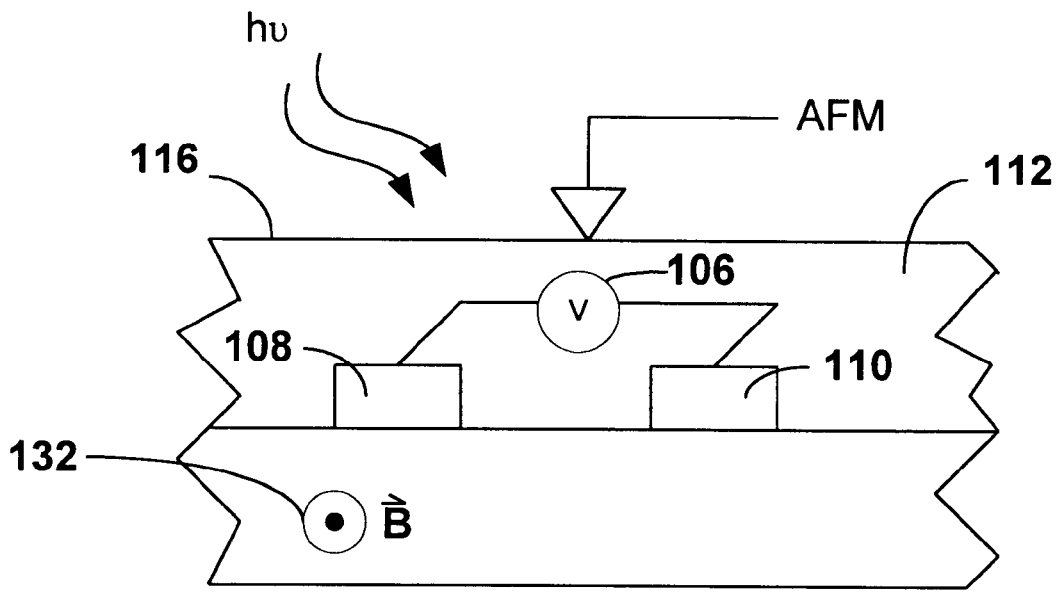
FIG. 5 is a cross section diagram illustrating an exemplary method of FIG. 3 according to the present invention.

After step 114, an enhanced number of carriers within the ILD 112 are moved and the enhanced carriers are deflected toward the surface of the ILD surface 116 of FIG. 5 at step 130 of FIG. 3. According to a preferred embodiment of the invention, the carrier deflection is accomplished by subjecting the ILD 112 to a magnetic field 132, as illustrated in FIG. 5. The magnetic field 132 is oriented in a direction perpendicular to the direction of current flow (which is between the conductive lines 108 and 110) and deflects the carriers toward the ILD surface 116 in accordance with the Hall effect which will now be discussed and explained in conjunction with FIG. 6.

Figure 6:
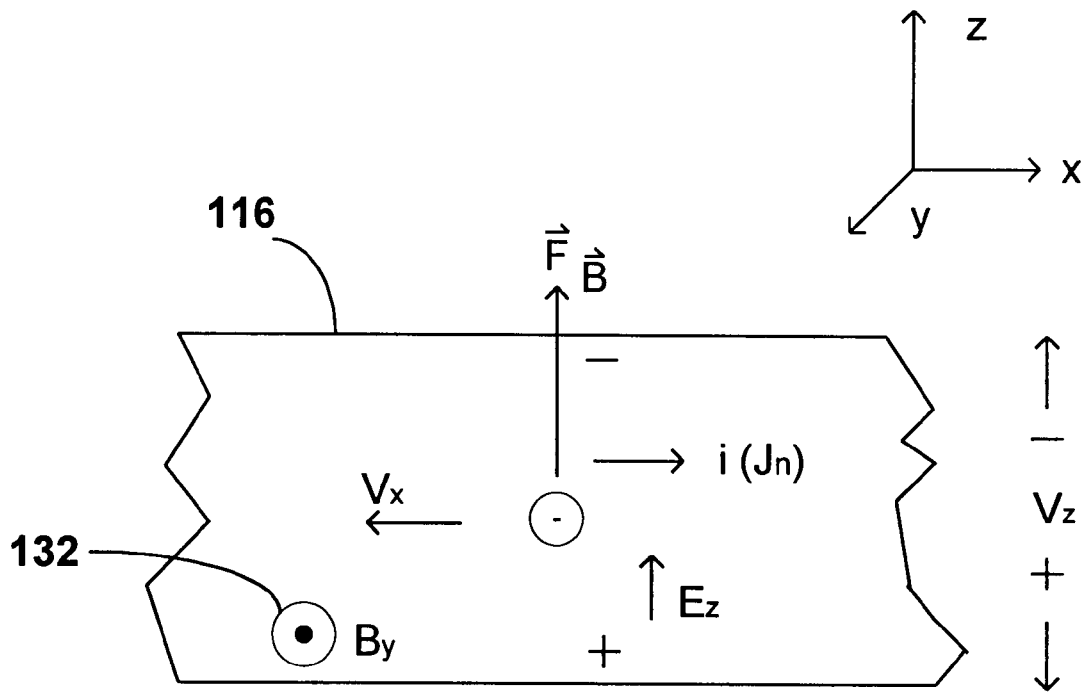
FIG. 6 is a cross section diagram illustrating the Hall effect and how a charged particle traveling through a material in the presence of a magnetic field which is perpendicular to the current exerts a force on the charged particle.

The force exerted on a particle in the presence of an electric and magnetic field is called the Lorentz force and is represented by:

$$F = q(E + v \times B),$$

wherein E is the electric field vector, B is the magnetic field vector and v is the charged particle velocity vector (which in the case of the present invention is in a direction opposite to the direction of current flow). As can be seen by the above equation, the force exerted by the magnetic field component is in a direction perpendicular to the flow of current if the magnetic field is oriented in a direction perpendicular to the direction of current flow since the magnetic force component (qv×B) is determined by the "curl" of the velocity vector and the magnetic field vector. As illustrated in FIG. 6, if the current (i) is in the positive "x" direction (and thus the velocity vector is in the negative "x" direction) and the magnetic field 132 is directed perpendicularly out of the page, then, according to the "right hand rule", the force exerted on the particle due to the magnetic field will be in the positive "z" direction, thus deflecting the particle toward the ILD surface 116, as illustrated in FIG. 6.

The Hall effect employs this particle deflection principle. In general, the Hall effect can be summarized as follows: a material containing a current flowing in the presence of a perpendicular magnetic field will result in a potential difference developing across the material. This can be easily seen in FIG. 6. When the magnetic field 132 deflects a carrier (whether positive or negative) towards the ILD surface 116, an accumulation of charge develops at that point on the ILD surface 116 which is proportional to the number of carriers in the ILD 112 at that point. The accumulation of charge thus results in the development of a voltage potential ($V_z$) across the wafer, which is referred to as the Hall voltage.

Once the carriers have been deflected toward the surface at step 130, thus causing a charge accumulation profile to form on the ILD surface 116, the charge profile is detected at step 140 of FIG. 3. In one exemplary embodiment of the present invention, the charge profile can be detected using a voltage probe, a voltage meter, an STM or the like. Preferably, however, the charge profile is detected using an atomic force microscope (AFM) such as a Dimension™ 5000 Scanning Probe Microscope manufactured by Digital Instruments. Using an AFM for detecting the charge profile is preferred because the tip is extremely small which allows for an extremely high resolution charge profile to be detected.

Figure 7:
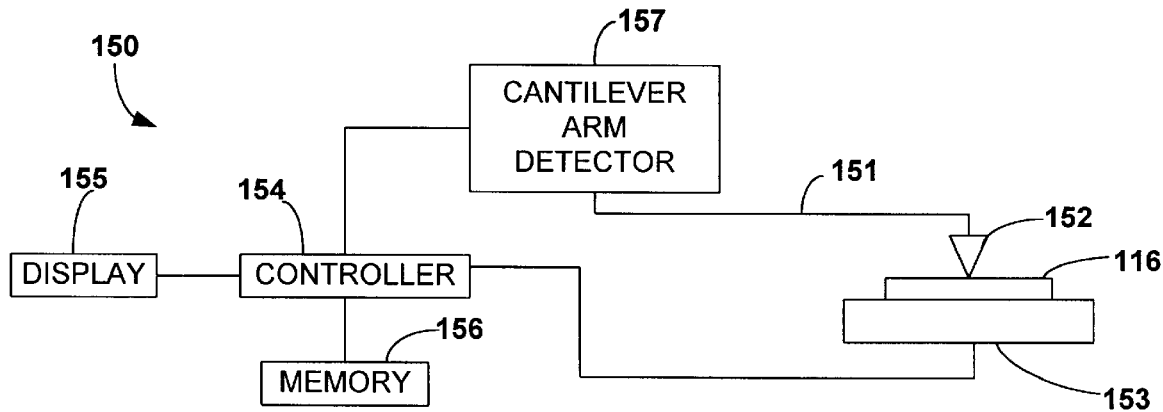
FIG. 7 is a block diagram of a charge detection system according to the present invention.

As is well known by those skilled in the art, an AFM 150, as illustrated in FIG. 7, includes a microminiature cantilever arm 151 and a sharp tip 152 which makes contact with the ILD surface 116. The wafer is placed on a scanning stage 153 which operates to move the wafer with respect to the probe tip 152 to effectively scan the ILD surface 116. The stage 153 may incorporate traditional movement or actuation means (not shown) and may also include piezoelectric actuators for effectuating high precision movement of the stage 153 to provide high resolution scanning. Alternatively, the stage 153 may be kept stationary while similar actuation means may be used to move the cantilever arm 151/probe tip 152 assembly. Regardless of which component is moved relative to the other, the AFM scanning mechanism 150 is controlled by a programmable controller 154 which is operable to receive and analyze detected characteristics such as the accumulated charge and display the collected information to the user via a display 155 and store the data in a memory 156. Although the detection system 150 of FIG. 7 does not illustrate a magnetic field means for the sake of simplicity, the magnetic field 132 of FIG. 5 may be provided using, for example, a permanent magnet, a solenoid, coils, etc. as is well known by those skilled in the art.

The AFM tip 152 preferably detects the accumulated charge in the following manner. As opposed to a contacting mode of operation in which the probe tip 152 rides on the surface 116 of the material to be measured to profile the surface topology, the AFM 150 is operated in a non-contacting mode. In the non-contacting mode, the AFM tip 152 is held a short distance from the ILD surface 116 (about 5 Angstroms to 500 Angstroms) and the tip 152 is deflected by electrostatic forces exerted against the tip 152 by the accumulated charge on the ILD surface 116. According to one exemplary embodiment of the present invention, the accumulated charge at a point on the surface 116 is proportional to the electrostatic force exerted on the AFM tip 152 which thus proportionally impacts the amount of deflection of the AFM tip 152. The amount of cantilever arm 151 deflection is preferably measured using precisely aligned optical components and a deflection measurement circuit (shown collectively as a cantilever arm detector 157 in FIG. 7), although other techniques may be used and are contemplated as falling within the scope of the present invention. For example, the cantilever arm may resonate at a frequency that may be varied in response to the influence of the electrostatic forces caused by the accumulated charge.

Figure 9:
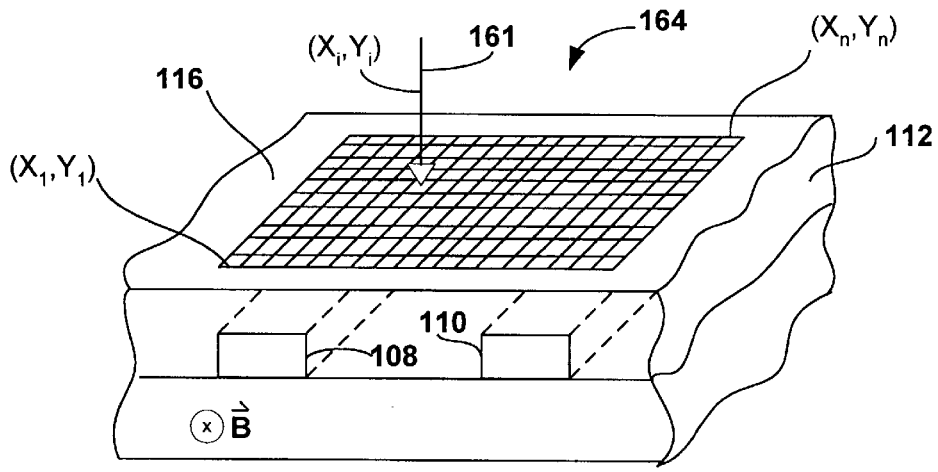
FIG. 9 is a fragmentary perspective view of the dielectric material illustrating the scanning of the surface using a charge detector to determine the presence of a defect at each point on the dielectric surface according to the present invention.
Figure 8:
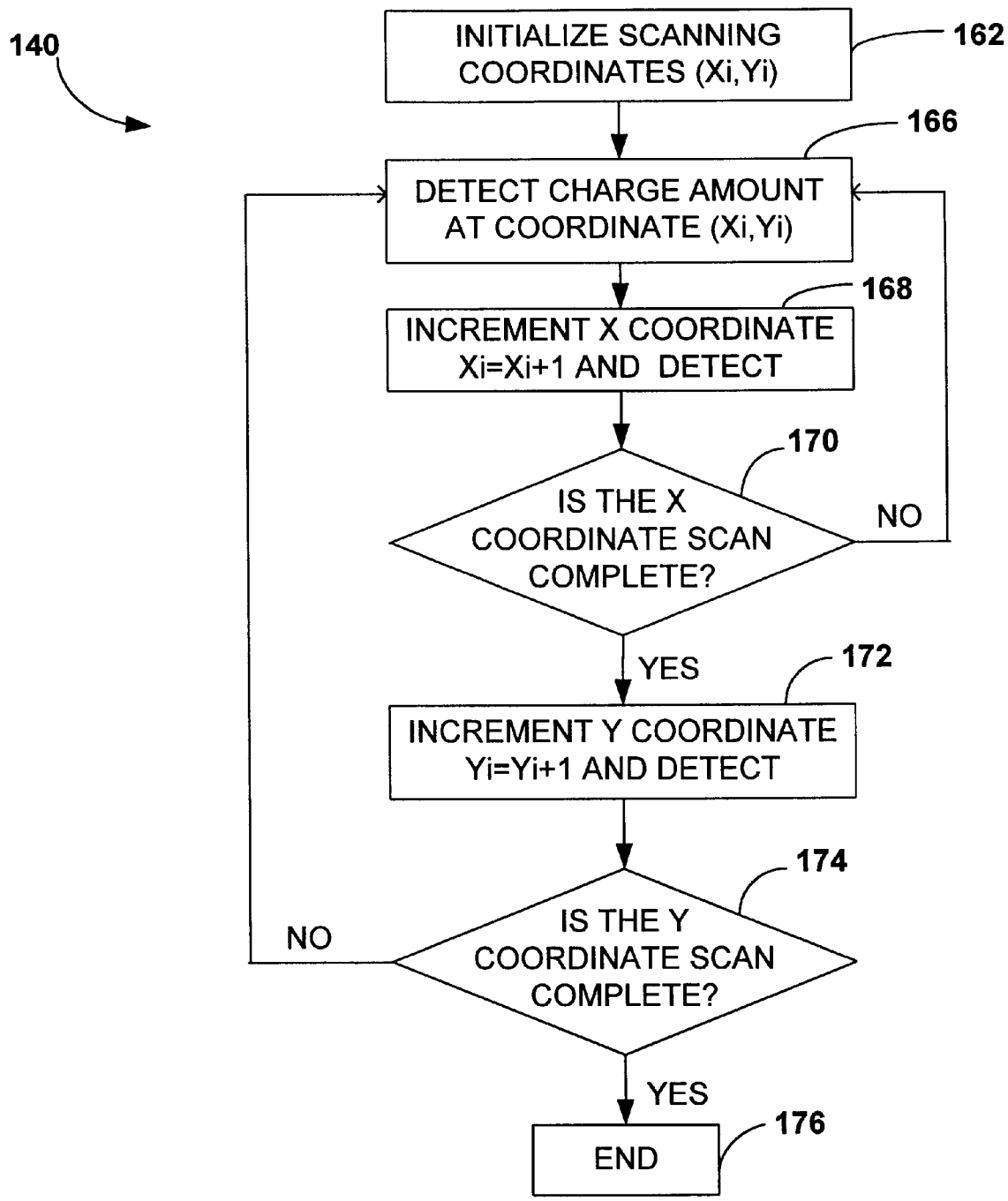
FIG. 8 is a flow chart diagram illustrating a method for detecting the accumulated charge profile on a surface of the dielectric material by scanning the surface and detecting the charge at each point according to the present invention.

An exemplary method 140 of detecting the charge profile includes scanning the ILD surface 116 with a charge detector 161 such as an AFM, as illustrated in the flow chart of FIG. 8, which will be discussed in conjunction with FIG. 9. Under the control of a microcontroller, the detector 161 initializes the scanning coordinates at step 162 so that the detection scheme begins at a first coordinate ($X_1$, $Y_1$). Preferably, the first coordinate ($X_1$, $Y_1$) is at a corner of a square grid 164, as illustrated in FIG. 9, and the grid 164 is scanned by the detector 161 row by row. Alternatively, any method of scanning some or all of the points on the grid 164 may be used and each is contemplated as falling within the scope of the present invention.

Once the detector 161 is at the coordinate ($X_1$, $Y_1$), the detector 161 detects the charge amount at that point at step 166 by detecting the voltage at that point by, for example, detecting the amount of deflection of the AFM tip 152 due to the electrostatic force exerted by the accumulated charge as discussed above. After the charge amount is detected at step 166, the detector 161 is moved to the next coordinate (e.g., $X_2$, $Y_1$) at step 168 and the charge amount at that point is detected. The detector 161 continues scanning and detecting in the "x" direction until the "x" coordinate scan is complete at step 170 (YES), which indicates that the detector 161 has completed a row scan. The detector 161 then moves its position incrementally in the "y" direction at step 172 to start scanning a new row (e.g., $X_i$, $Y_2$). The method 160 checks to see whether the grid scan is complete at step 174 by checking whether all the rows have been scanned. According to the present example, all the rows have not yet been scanned (NO), and the method 140 returns to step 166 to scan the row in the "x" direction. Once all the rows have been scanned (YES at step 174), the method 140 for detecting the charge profile on the wafer surface 110 is completed at step 176.

Returning now to FIG. 3, once the charge profile on the ILD surface 116 has been detected at step 140, the method 100 uses the detected charge profile to detect the location of defects in the ILD 112 at step 180. According to the present invention, the defects are detected two-dimensionally using the charge profile (i.e., the measured Hall voltages) in the following manner.

Figures 10, 11:
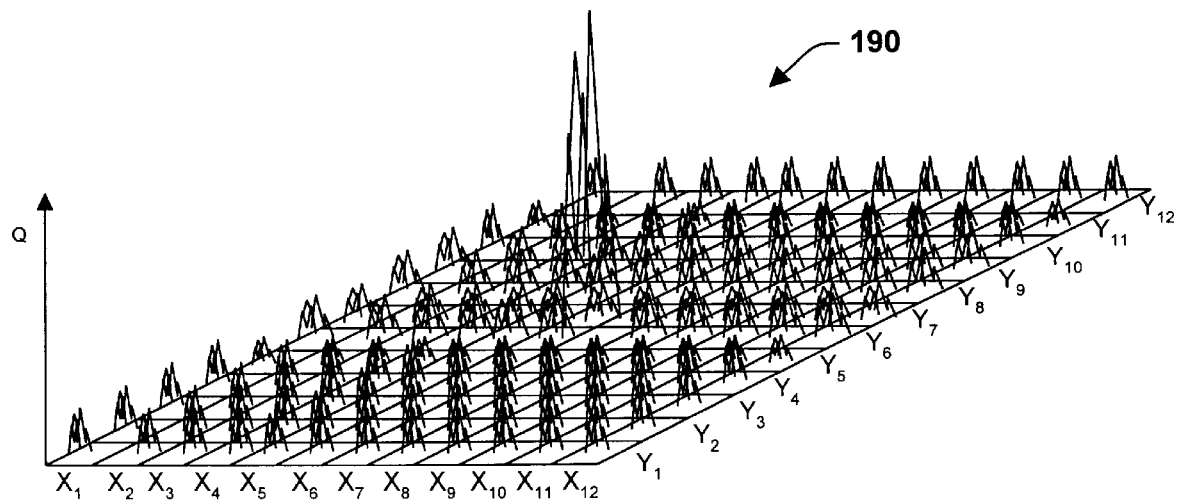
FIG. 10 is a representative grid map of a portion of an interlayer dielectric illustrating accumulated charge amplitudes taken at grid blocks of the grid map in accordance with the present invention.
FIG. 11 is an accumulated charge amplitude table correlating the accumulated charge amplitudes of FIG. 10 with expected values for the accumulated charge in accordance with the present invention.

The accumulated charge profile which is detected at step 140 of FIG. 3 is preferably saved in the memory 156 of FIG. 7. The charge profile represents the carriers associated with both the free electrons due to the trapping sites at or near ion contaminant defects and the free electrons in the ILD 112. Thus, for the grid 164 of FIG. 9, wherein n=12, a two-dimensional grid of 144 points exist, as illustrated in FIGS. 10 and 11. Note that FIG. 10 is not drawn to scale, but rather is used to clearly illustrate the present invention. Likewise, in FIGS. 10 and 11, n=12 is used to clearly illustrate the invention and "n" may equal a much large number since the AFM system 150 provides high spatial resolution for scanning the ILD surface 116.

FIG. 10 is a three-dimensional graph 190, wherein the charge amplitude Q is plotted for each coordinate $(X_i, Y_j)$ on the ILD surface 116. Because the locations within the ILD 112 that contain ion contaminant defects will contain additional carriers than the regions not containing defects due to the trapping sites, those locations $(X_i, Y_j)$, will have a larger accumulated charge at the surface 116 than the charge at the other surface locations. Likewise, since the locations within the ILD 112 that contain void defects will contain less carriers than the regions not containing defects, those surface locations $(X_i, Y_j)$ will have less accumulated charge than the charge at the other surface locations. In the above manner, the accumulated charge profile may be used to identify the two-dimensional location of defects in the ILD 112.

The manner in which the controller 154 evaluates the charge profile saved in the memory 156 to determine the location of defects may be accomplished in a variety of ways and each is contemplated as falling within the scope of the present invention. Preferably, the controller 154 compares the charge Q at each point $(X_i, Y_j)$ of the grid 164 to an expected charge amplitude value or range $Q_E$. The range $Q_E$ is a charge range within which a conclusion is made that no defects are present at that $(X_i, Y_j)$ position in the ILD 112 and thus represents the amount of accumulated charge associated solely with the ILD carriers excited by the light energy. If the charge Q at a location $(X_i, Y_j)$ is greater than or less than the expected charge range $Q_E$, the controller 154 notes that the location $(X_i, Y_j)$ contains an unexpected charge value $Q_U$, as illustrated in FIG. 11 (wherein i=7 and j=6).

As discussed above, the present invention provides for the location of defects two-dimensionally in the ILD 112. Therefore the (X, Y) coordinates of the defect are known, although the depth at which the defect is located within the ILD 112 is still unknown. The present invention may also be used to determine the depth of the defect and thereby provide a location of the defects three-dimensionally. A method 200 for mapping defects in the ILD 112 three-dimensionally is illustrated in FIG. 12.

Figure 4:
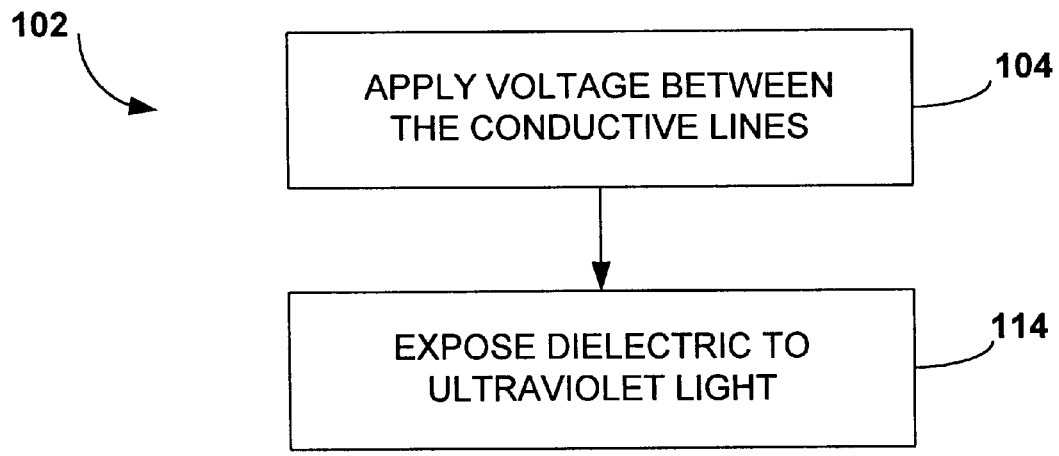
FIG. 4 is a flow chart diagram illustrating a method of moving carriers in an interlayer dielectric according to the present invention.

The method 200 moves the carriers at step 102, which includes generating a leakage current and enhancing the carriers with light energy as discussed supra in conjunction with FIGS. 3 and 4. Subsequently, a portion of the carriers are deflected toward the ILD surface 116 at step 202, wherein the portion of the carriers which are activated correspond to a depth of the ILD 112. That is, initially a shallow region is selected and only that portion of the ILD 112 will have their carriers deflected to the ILD surface 116. Deflecting the carriers within a selected depth may be accomplished through a variety of methods and each is contemplated as falling within the scope of the present invention. According to one embodiment, the wavelength of the light source used to enhance the carriers in the ILD may be varied so that the light energy is absorbed beyond the selected depth. Consequently, only the carriers within the selected depth are deflected all the way to the ILD surface 116. Alternatively, the magnetic field 132 may be selectively shielded from portions of the ILD 112 so that only carriers within the selected depth are deflected.

After the carriers within a selected depth are deflected to the ILD surface 116 at step 202, the accumulated charge profile is detected at step 140a in the same manner as discussed supra in conjunction with FIGS. 3 and 7–12. The detected charge profile is stored in memory and carriers are deflected within another selected ILD depth at step 204. Preferably, the depth at which the carriers are deflected is deeper than the first depth and the resulting accumulated charge profile is detected and stored at step 140b. The method 200 then determines whether additional depth deflections are desired at step 206. If more data is desired (YES), carriers are deflected at another depth and detected. If not (NO), the charge accumulation data acquisition is complete and the three-dimensional position of the defects are determined at step 208.

Figure 12:
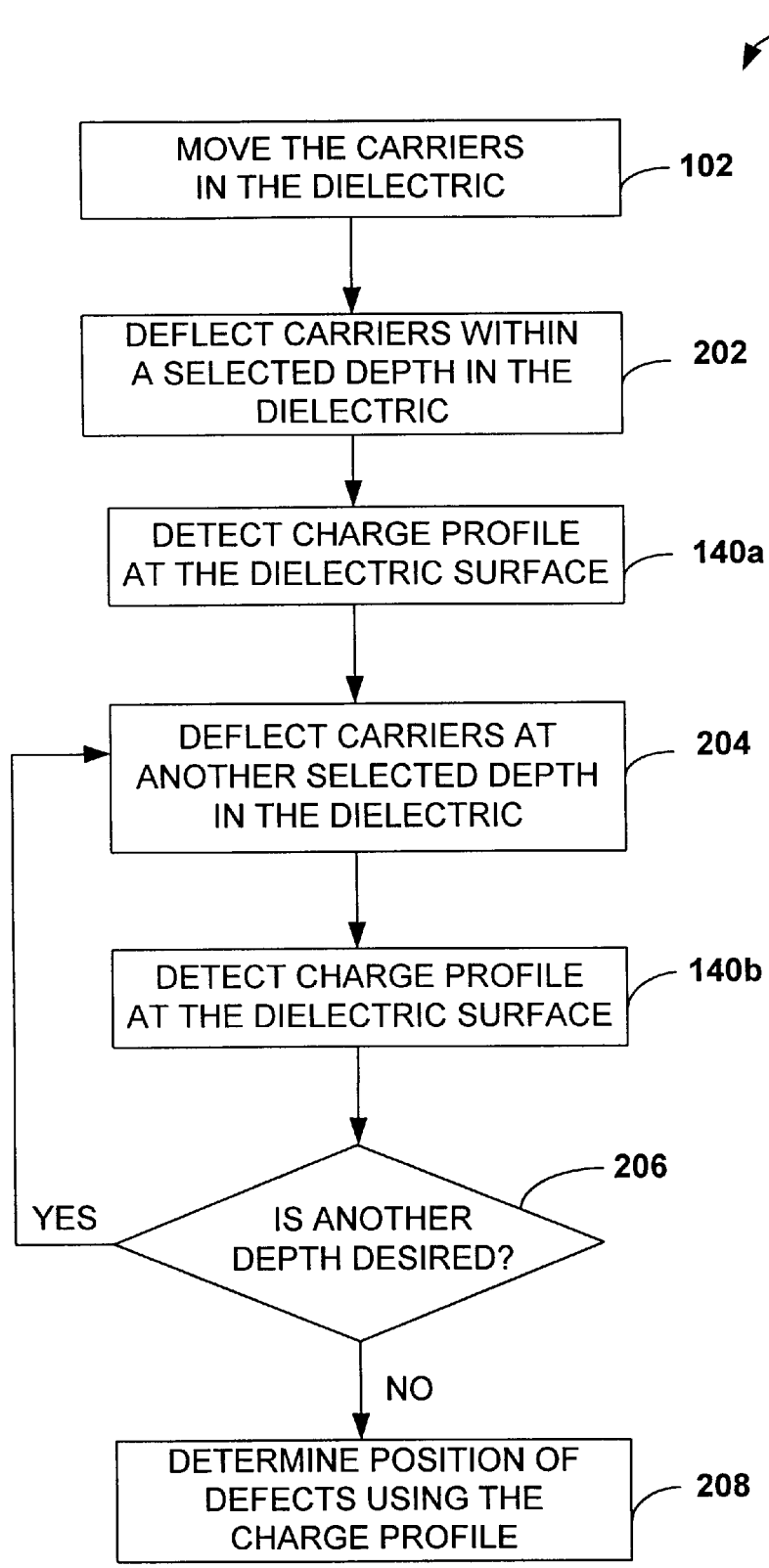
FIG. 12 is a flow chart diagram illustrating a method of detecting defects in the interlayer dielectric according to the present invention, further including identifying the three dimensional position of the defects within the interlayer dielectric material.

Once the plurality of charge accumulation profiles have been detected and stored in the memory 156 of FIG. 7, the controller 154 uses the profiles to determine the depths of the defects at step 208 of FIG. 12. For example, if the charge profile at the first depth (e.g., the most shallow depth) has an accumulated charge within the expected charge range $Q_E$ for each (X, Y) point, the controller 154 determines that no defects are at that depth. The controller 154 then evaluates the charge accumulation profile at the next incremental depth which includes the accumulated charge profile from the first, more shallow depth. The controller 154 then subtracts the earlier shallow charge profile from the deeper profile which provides a charge profile which reflects whether any voids or ion contaminants exist at the second depth. The controller 154 then repeats the above process until all the depth profiles have been evaluated. In the above manner, the three-dimensional location (X, Y, Z) of defects is detected in the ILD material 112.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of detecting defects in a dielectric material, comprising the steps of:

moving one or more carriers in the dielectric material, wherein a number of carriers is a function of defects in the dielectric material;

deflecting the carriers toward a surface of the dielectric material; and detecting an accumulated charge on the surface of the dielectric material due to the deflected carriers.

2. The method of claim 1, wherein moving carriers comprises applying a bias voltage across a portion of the dielectric material, thereby inducing a leakage current.

3. The method of claim 2, wherein moving carriers further comprises exposing the dielectric material to light energy to enhance a number of carriers in the dielectric material.

4. The method of claim 3, wherein the light energy is an ultraviolet light source with an energy which is greater than an energy barrier between the dielectric material and a conducting material associated therewith.

5. The method of claim 1, wherein deflecting the carriers comprises subjecting the dielectric material to a magnetic field.

6. The method of claim 5, wherein a direction of the magnetic field is perpendicular to a direction of flow of the carriers, wherein the magnetic field exerts a force on the carriers due to the Hall effect.

7. The method of claim 3, further comprising the step of varying a wavelength of the light energy, thereby moving the carriers at different depths which provides a charge accumulation profile having an indication of a depth of a defect in the dielectric layer.

8. The method of claim 1 wherein detecting the accumulated charge profile comprises:

placing a probe at a point on the surface of the dielectric material; and detecting a charge amount at the point.

9. The method of claim 8, further comprising determining whether a defect exists in the dielectric material at the point.

10. The method of claim 9, wherein determining whether a defect exists in the dielectric material comprises:

comparing the detected charge amount to a predetermined range; and determining that no defect exists at the point if the detected charge amount falls within the predetermined range, a contaminant defect exists at the point if the detected charge amount is greater than the predetermined range, and a void defect exists at the point if the detected charge amount is less than the predetermined range.

11. The method of claim 8, wherein detecting the charge amount comprises measuring a voltage potential at the point with respect to a reference point.

12. The method of claim 1, wherein detecting the accumulated charge profile comprises:

placing an atomic force microscope tip at a point near the surface of the dielectric material; and detecting an amount of deflection of the tip due to an electrostatic force exerted on the tip by the accumulated charge at the point.

13. The method of claim 1, wherein detecting an accumulated charge comprises:

(a) initializing a scanning coordinate of a detection apparatus;

(b) detecting a charge amount at a first point on the material surface;

(c) moving the detection apparatus to another point on the material surface;

(d) detecting the charge amount at the other point; and (e) repeating steps (c) and (d) until the surface of the material is substantially scanned and an accumulated charge profile is detected.

14. The method of claim 1, wherein detecting an accumulated charge comprises:

(a) initializing a scanning coordinate for a charge detector;

(b) scanning a first row in a first direction and detecting the accumulated charge at a plurality of points in the first row with the charge detector;

(c) moving the charge detector in a direction perpendicular to the first row to a next row;

(d) scanning the next row in a direction generally parallel to the first direction and detecting the accumulated charge at a plurality of points in the next row with the charge detector;

(e) repeating steps (c) and (d) until the surface of the material is substantially scanned and an accumulated charge profile is detected.

15. The method of claim 1, wherein detecting an accumulated charge comprises:

(a) initializing a scanning coordinate for an atomic force microscope tip;

(b) placing the atomic force microscope tip near the surface of the dielectric material at the initialized coordinate;

(c) detecting a charge amount at the initialized point on the material surface;

(d) moving the atomic microscope tip in a first direction to another point near the material surface;

(e) detecting the charge amount at the other point;

(f) repeating steps (d) and (e) until the atomic force microscope tip has scanned a predetermined number of points in the first direction, thereby scanning a row;

(g) moving the tip in a second direction substantially perpendicular to the first direction to another row;

(h) detecting a charge amount at the point of the atomic force microscope tip location;

(i) repeating steps (d) and (e) until the atomic force microscope tip has scanned a predetermined number of points in the first direction or a direction generally parallel to the first direction, thereby scanning another row; and (j) repeating steps (g), (h) and (i) until the atomic force microscope has scanned substantially the entire surface of the material.

16. The method of claim 15, wherein detecting the charge amount comprises:

placing an atomic force microscope tip at a point near the surface of the dielectric material; and detecting an amount of deflection of the tip due to an electrostatic force exerted on the tip by the accumulated charge at the point.

17. A system for detecting defects in a dielectric material, comprising:

a stage accommodating a dielectric material to be evaluated;

an atomic force microscope system operatively coupled to the stage;

means for moving one or more carriers in the dielectric material;

magnetic field means for subjecting the dielectric material to a magnetic field having an orientation for deflecting the moving carriers in the dielectric material to a surface of the dielectric material in accordance with the Hall effect, thereby generating an accumulated charge profile on the dielectric material surface; and a controller operatively coupled to the stage and the atomic force microscope for dictating the detection of the accumulated charge profile on the dielectric material and controlling a positional relationship between the stage and the atomic force microscope.

18. The system of claim 17, wherein the atomic force microscope comprises a microminiature cantilever arm and an atomic force microscope tip for detecting the accumulated charge profile on the dielectric material.

19. The system of claim 18, wherein the atomic force microscope operates in a non-contacting mode and detects the accumulated charge profile by sensing a deflection of the cantilever arm and tip due to electrostatic forces exerted by the charge profile on the tip.

20. The system of claim 19, wherein the atomic force microscope further comprises a cantilever arm detector which senses the deflection of the cantilever arm and converts the sensed deflection to a detected charge value.

21. The system of claim 17, wherein the controller saves the detected accumulated charge profile as data in a memory, and uses the data to determine whether a void or a contaminant defect is present.

* * * * *